(12) United States Patent
Cho et al.

(10) Patent No.: US 7,712,621 B2
(45) Date of Patent: May 11, 2010

(54) HOUSING WITH HIDDEN VENTILATION HOLES

(75) Inventors: Cheng-Chi Cho, Taipei (TW); Yong-Jhih Su, Taipei (TW)

(73) Assignee: D-Link Corporation, Taipei (TW)

( * ) Notice: Subject to any disclaimer, the term of this patent is extended or adjusted under 35 U.S.C. 154(b) by 1022 days.

(21) Appl. No.: 11/437,747

(22) Filed: May 22, 2006

(65) Prior Publication Data

US 2007/0268663 A1    Nov. 22, 2007

(51) Int. Cl.
*B65D 6/24* (2006.01)
(52) U.S. Cl. .................................... 220/4.28
(58) Field of Classification Search ............... 220/4.26, 220/4.28; 206/335; 312/223.2
See application file for complete search history.

(56) References Cited

U.S. PATENT DOCUMENTS 5,383,098 A * 1/1995 Ma et al. ..................... 361/818
5,613,237 A * 3/1997 Bent et al. ................... 455/351

* cited by examiner

*Primary Examiner*—Stephen Castellano
(74) *Attorney, Agent, or Firm*—Bacon & Thomas, PLLC

(57) ABSTRACT

The present invention is to provide a housing of an electronic device having a plurality of hidden ventilation holes, which comprises an intermediate frame, an upper shell and a lower shell, wherein the intermediate frame comprises an upright flange along the outer edges thereof, the upper shell and the lower shell respectively have its edge secured to an inner edge inside the flange of the intermediate frame, the upper shell and the lower shell both comprise a plurality of spaced cavities formed along the edge of the upper shell and the lower shell, and both the cavities are concealed behind the flange when the intermediate frame is assembled with the upper shell and the lower shell respectively, so as to maintain a structural strength of the housing and to be looked aesthetic.

4 Claims, 7 Drawing Sheets

HOUSING WITH HIDDEN VENTILATION HOLES

FIELD OF THE INVENTION

The present invention relates to housing of electronic device, and more particularly to two sides of an intermediate frame respectively secured by an upper shell and a lower shell which both having a plurality of spaced cavities formed along the edge thereof, and these cavities are concealed behind a flange that extended from outer edge of the intermediate frame, so as to form hidden ventilation holes.

BACKGROUND OF THE INVENTION

This world has entered into a new era with information and electronic technologies being progressed rapidly. A wide variety of computer related advanced products and mobile communication products are commercially available. Moreover, network communication technology has known a fast development in recent years. Characteristics of these computer related advanced products and mobile communication products are comprised of compactness, multifunction, and low price, therefore people love to use these kinds of 3C products and even ask more from them. In the other aspect, continuous advancements of these electronic devices are desired by people. Advanced circuitry including a main processing unit is employed by these powerful electronic devices so as to provide more useful functionalities to users. An electronic component of relatively high operation speed produces relatively greater amount of energy (i.e., higher temperature due to high heat). Thus, excessive high working temperature may adversely affect a normal functioning of an electronic device if it does not have an effective heat dissipation means. To the worse, a useful product life of the electronic device may get shortened quickly. And in turn, it may greatly decrease sales of such electronic devices in the market.

Conventionally, as most common, cost effective means for dissipating heat generated by an electronic device, a plurality of large ventilation holes are provided on the housing of the electronic device. Hot air inside the electronic device is adapted to draw to outside of the electronic device through the ventilation holes and at the same time outside cooling air is circulated through the ventilation holes to effectively lower the inside temperature of the electronic device during operation. These ventilation holes formed on the housing of an electronic device are adapted for ventilation (i.e., heat removal). However, structural intension of the housing of the electronic device may be decreased significantly due to many ventilation holes. Thus, the structurally weak housing of such electronic device is subject to deformation or damage due to collision during transportation. Further, the provision of ventilation holes on the housing of an electronic device is not aesthetic as viewed by many designers of the art in consideration of the fast development of electronic devices. Thus, electronic devices produced by manufacturers of the art are required to have an effective heat dissipation means. Also, drawbacks (e.g., reduction of structural intension and being not aesthetic) associated with the provision of ventilation holes on the housing are required to be eliminated from an electronic device. Therefore, consumers may like to and are willing to buy these electronic devices. Another drawback of the provision of ventilation holes is that the ventilation holes, in accordance with the specifications of related rules, are required to be sufficiently small. Otherwise, sparks due to malfunction of circuitry of an electronic device may spread to the outside of the electronic device through the ventilation holes and may even cause accident. This potential danger is not desired.

Currently, a wide variety of network communication products are commercially available. Thus, whether network communication products to be produced having the advantage of ventilation holes (i.e., ventilation) and not having the disadvantages of ventilation holes (e.g., reduction of structural intension and being not aesthetic) will be an indicator to decide whether manufacturing technology related to network communication products of one company is more advanced than other competitive companies. Thus, it is desirable among manufacturers of the art to provide an electronic device having a novel housing with hidden ventilation holes having the advantages of reduced diameter, being aesthetic, and effective heat removal in order to fulfill the user needs and be more competitive in the market.

SUMMARY OF THE INVENTION

After considerable research and experimentation, a housing of an electronic device having hidden ventilation holes according to the present invention has been devised so as to overcome the above drawbacks of the prior art housing.

It is an object of the present invention to provide a housing of an electronic device having a plurality of hidden ventilation holes comprising an intermediate frame, an upper shell, and a lower shell wherein the intermediate frame comprises an upright flange along its outer edges, the upper shell and the lower shell both have its edge secured to a inner edge inside the flange of the intermediate frame, the upper shell comprises a plurality of spaced first cavities formed along the lower edge, the lower shell comprises a plurality of spaced second cavities formed along the upper edge, and both the first and second cavities are concealed by and hidden behind the flange when the intermediate frame is assembled with the upper shell and the lower shell respectively. By utilizing this housing formed with hidden ventilation holes, the ventilation holes are concealed, a structural strength of the housing is maintained, and the housing is aesthetic.

The above and other objects, features and advantages of the present invention will become apparent from the following detailed description taken with the accompanying drawings.

DETAILED DESCRIPTION OF THE PREFERRED EMBODIMENTS

Figure 1:
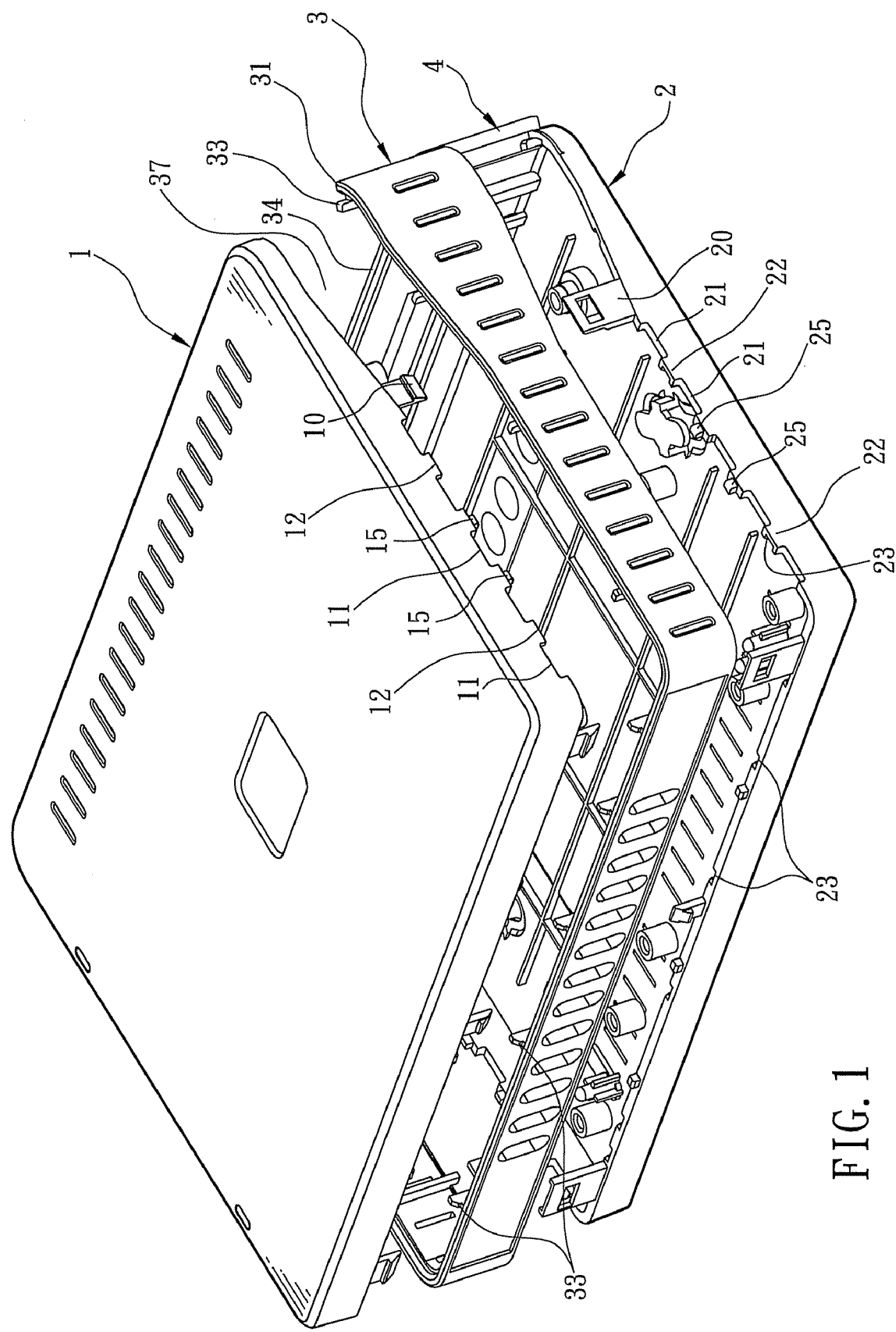
FIG. 1 is an exploded view of a preferred embodiment of housing of an electronic device according to the invention.
Figure 2:
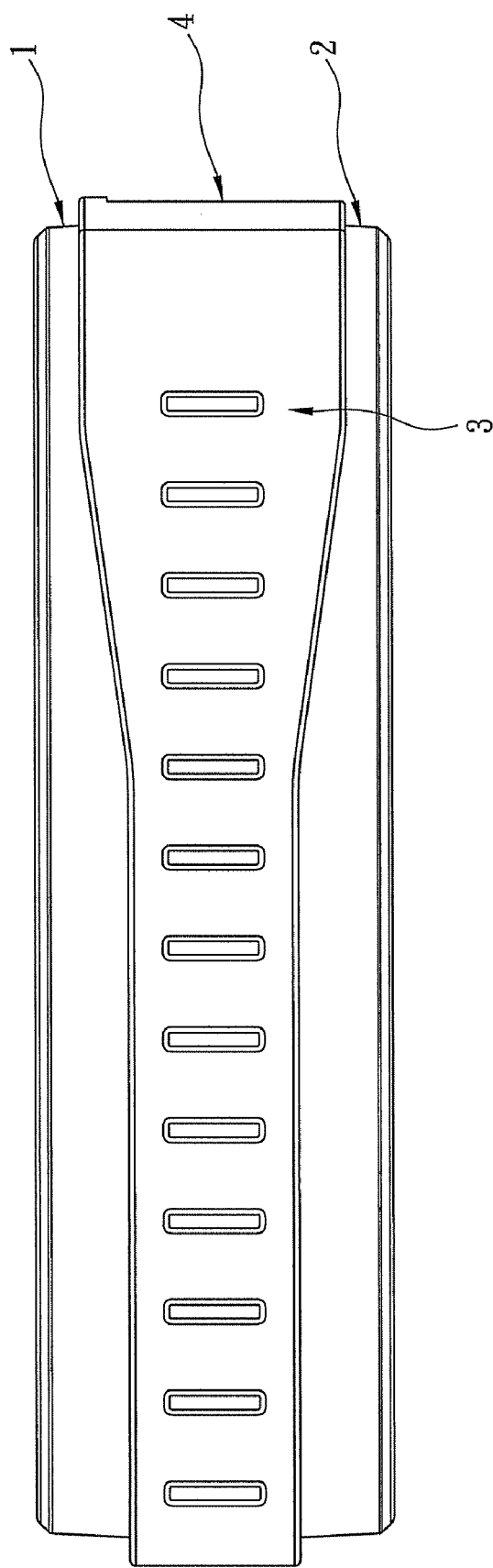
FIG. 2 is a side elevation of the assembled housing.

Referring to FIGS. 1 and 2, a housing of an electronic device having hidden ventilation holes in accordance with a preferred embodiment of the invention is shown. The housing comprises an upper shell 1, a lower shell 2, and an intermediate frame 3. The intermediate frame 3 is hollow and is mounted between the upper shell 1 and the lower shell 2. The intermediate frame 3 comprises an U-shaped upright flange 31 along outside of its three edges. Edges of both the upper shell 1 and the lower shell 2 are secured to top and bottom edges inside of the flange 31 respectively. The upper shell 1 comprises a plurality of first fastening members (e.g., latches as shown) 10 extended downward from the edge of the upper shell 1 to be proximate to the lower shell 2. Correspondingly, the lower shell 2 comprises a plurality of second fastening members (e.g., risers having an aperture as shown) 20 extended upward from the edge of the lower shell 2 to be proximate to the upper shell 1. The second fastening members 20 and the first fastening members 10 are mating members each other, so as the second fastening members 20 are able to be secured to the first fastening members 10. Also the first fastening members 10 and the second fastening members 20 are secured at a position proximate an inner surface of the intermediate frame 3. As a result, the intermediate frame 3 is securely fastened by both the upper shell 1 and the lower shell 2. This has the effect of enhancing a structural strength of the assembled housing.

Figure 3:
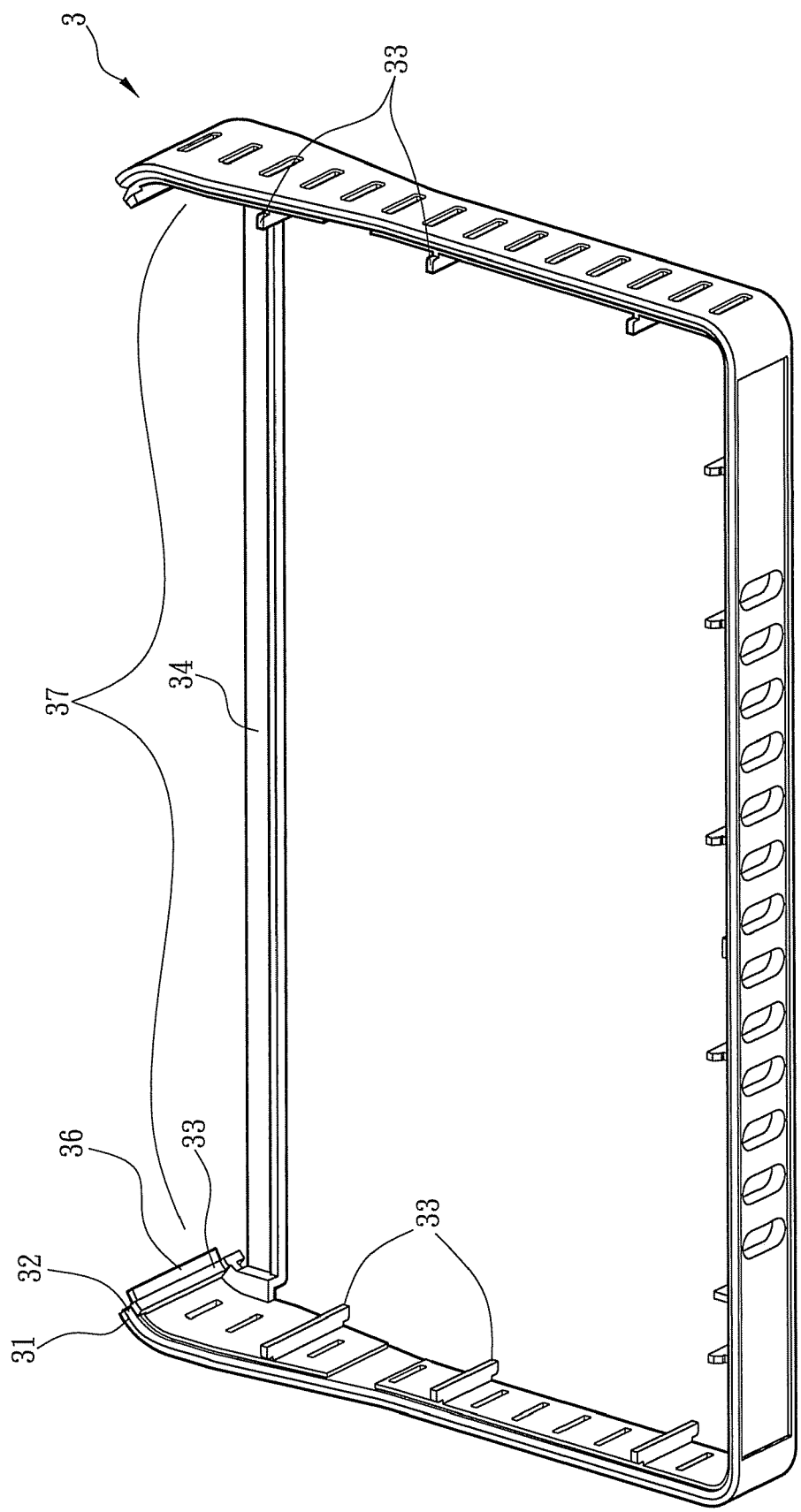
FIG. 3 is a perspective view of the intermediate frame.
Figure 4:
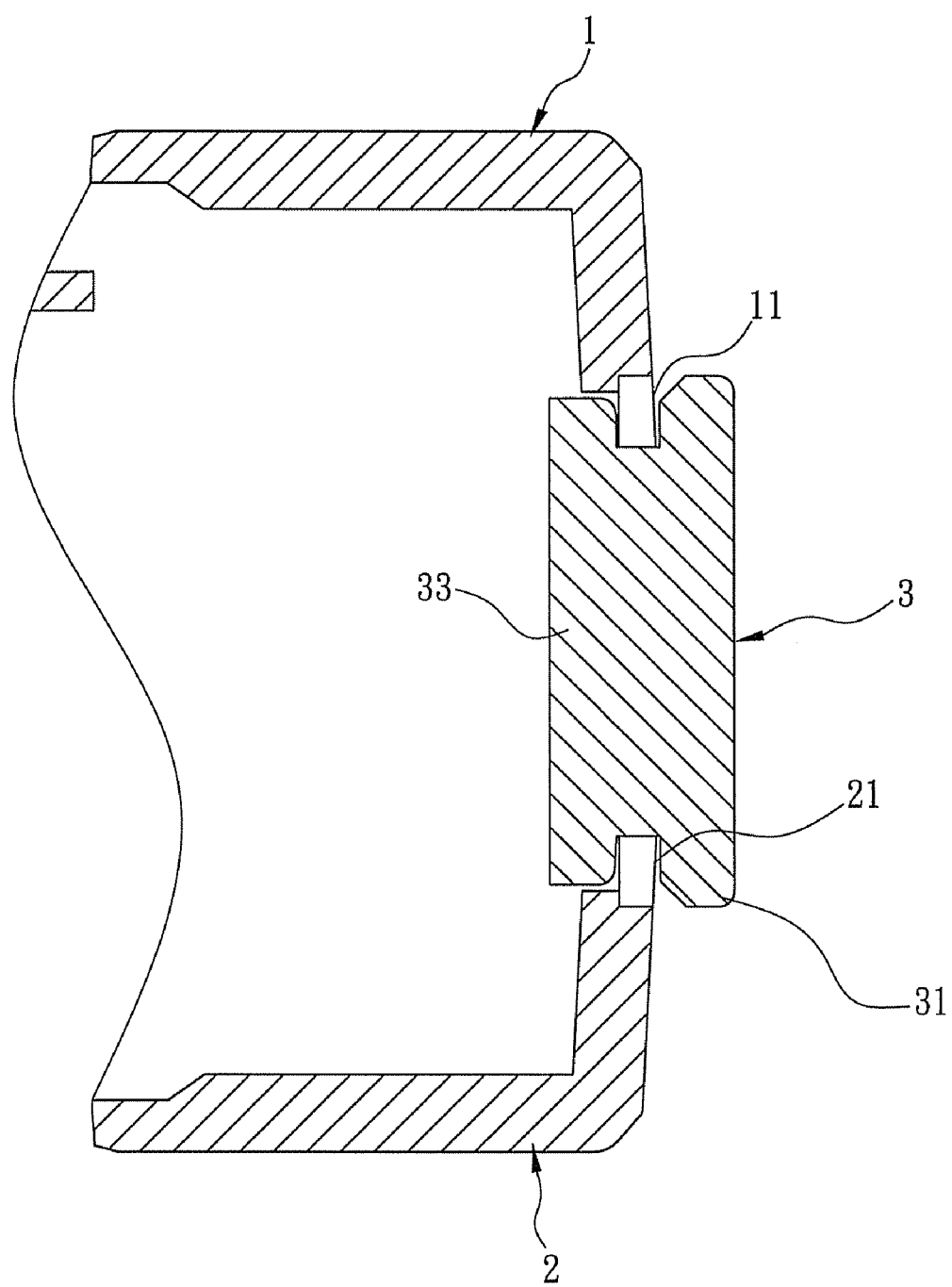
FIG. 4 is a sectional view of a portion of the housing.

Referring to FIG. 3 in conjunction with FIGS. 1 and 2, the intermediate frame 3 is presented U-shaped. The intermediate frame 3 further comprises a ramp 32 at either end of the flange 31. The ramp 32 is disposed between the end of the flange 31 and the inner edge of the intermediate frame 3. A plurality of spaced first cavities 11 are formed along either bottom face of a peripheral flange of the upper shell 1. A plurality of spaced second cavities 21 are formed along either top face of a peripheral flange of the lower shell 2. Both the first and second cavities 11 and 21 are concealed by the flange 31 and hidden behind the flange 31 when the upper shell 1 and the lower shell 2 are assembled with the intermediate frame 3 as referring to FIG. 4. As illustrated in FIG. 4, the cooling air outside is adapted to draw through the first and second cavities 11 and 21 by passing the ramps 32 at ends of the flanges 31. A user can see a ventilation hole formed by two adjacent first and second cavities 11 and 21 by tilting the electronic device a predetermined angle. To the contrary, a user only can see the flange 31 of the intermediate frame 3 rather than both the first and second cavities 11 and 21 when the eyes of the user and the electronic device are at the same elevation (see FIG. 2). Thus, a user has to tilt the electronic device a predetermined angle prior to seeing either the first cavity 11 (see FIG. 5) or the second cavity 21. It is contemplated by the invention that a plurality of ventilation holes are formed on the housing, the ventilation holes are concealed, structural strength of the housing is maintained, and the housing is aesthetic. Referring to FIG. 1 again, each of the first and second cavities 11 and 21 are both presented to a half-elliptic shape. Hence, both the upper shell 1 and the lower shell 2 can be mass produced easily. This is a contrast to a small amount of molding which involves complicated molds such as runners as experienced by the prior art. As a result, the invention can simplify manufacturing processes, save labor, and reduce manufacturing cost.

Referring to FIGS. 1 and 3 again, for assembling the intermediate frame 3 with a larger size of electronic device, the length of the intermediate frame 3 is required to increase. However, it may occur deformation of the intermediate frame 3 and even hinder a removal of the intermediate frame 3 from a mold in an injection molding process. For solving this problem, a connection rib 34 is formed for interconnecting both ends of the intermediate frame 3. The connection rib 34 also can increase a structural strength of the intermediate frame 3, resulting less of possibility of deformation in the injection molding process. Further, the connection rib 34 can be clamped while the intermediate frame 3 is subjected to spray-painting. Thus, to facilitate the process of spray-painting. Furthermore, the connection rib 34 is capable to ease the intermediate frame 3 to position between the upper shell 1 and the lower shell 2 in assembly. Because the connection rib 34 occupies little space, width and thickness of the connection rib 34 are adapted to change according to different sizes of the electronic devices.

Figure 6:
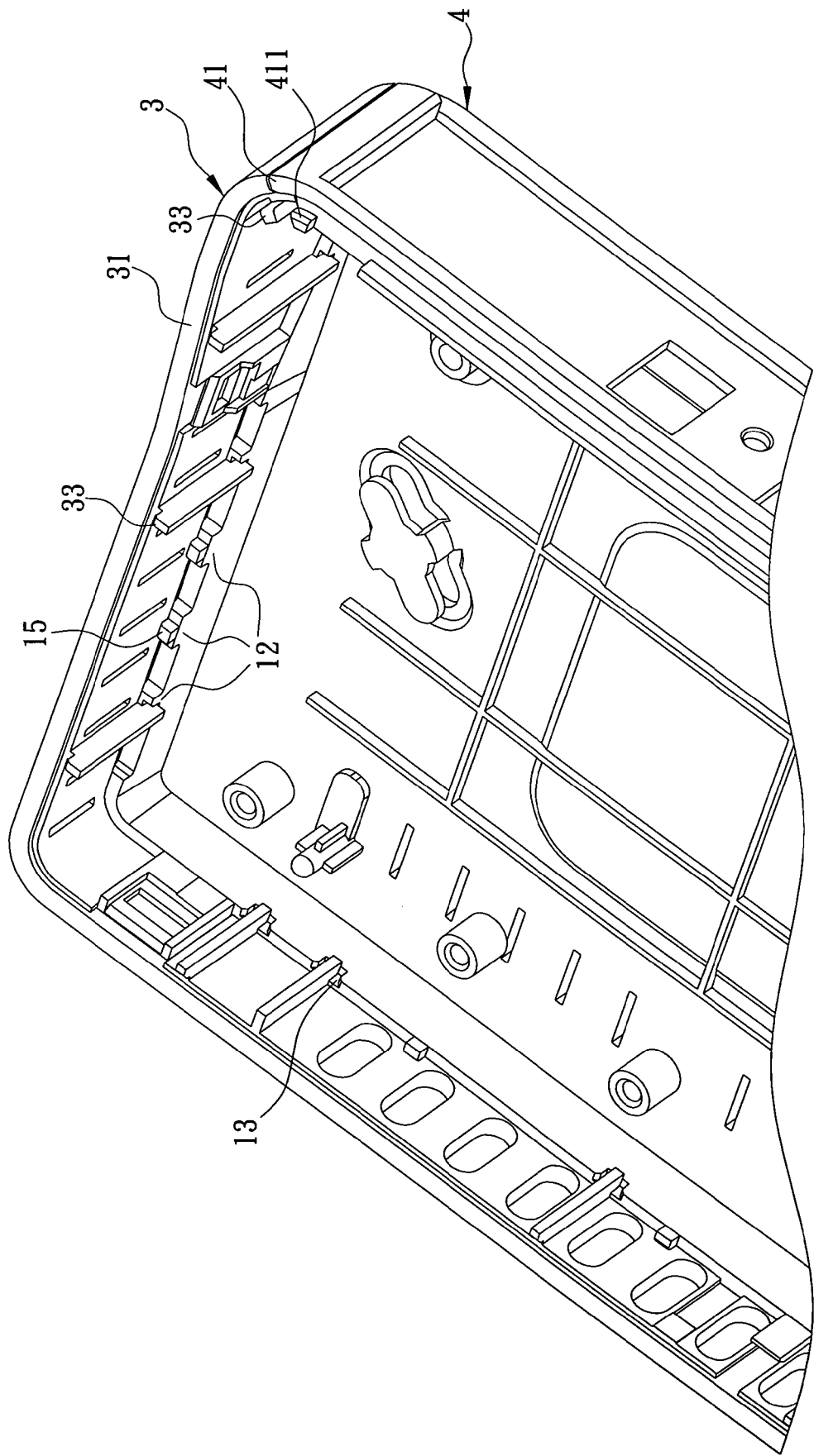
FIG. 6 is a perspective view of the housing with the upper shell removed to show its interior details.
Figure 7:
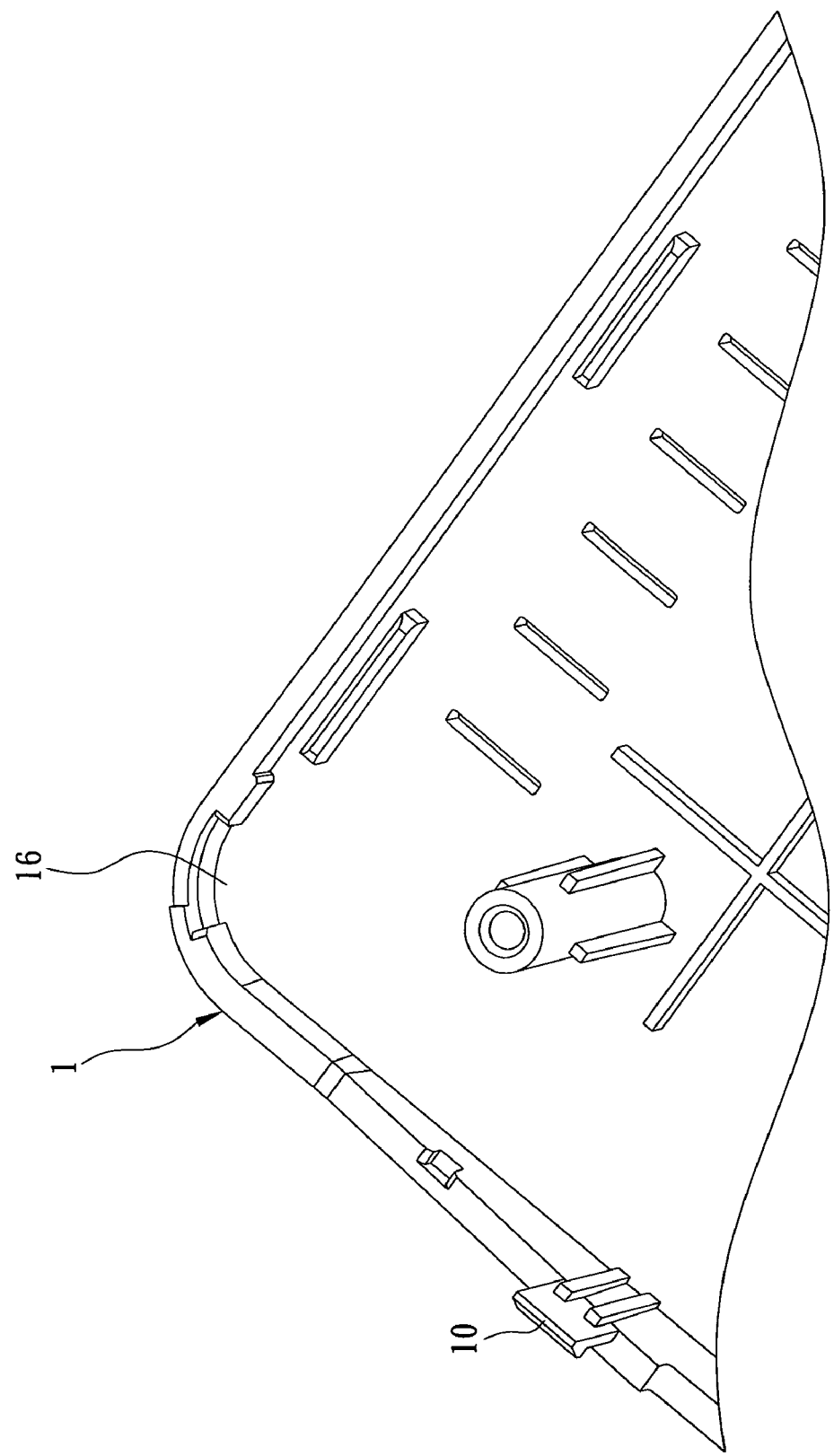
FIG. 7 is a view of a portion of the upper shell from an inside perspective to show details thereof.

Another consideration of the invention to prevent both the upper shell 1 and the lower shell 2 from excessively clamping the intermediate frame 3 in assembly, one or more of the upper shell 1, the lower shell 2, and the intermediate frame 3 may be deformed. Once deformed, edges of the upper shell 1 and the lower shell 2 are misaligned with the edges of intermediate frame 3 (see FIG. 4). This in turn can increase the manufacturing cost of assembling the housing of an electronic device. Referring to FIGS. 1, 6, and 7 a plurality of spaced first risers 12 are formed along either bottom face of a peripheral flange of the upper shell 1 in which each first riser 12 is formed between two adjacent first cavities 11. A plurality of spaced second risers 22 are formed along either top face of a peripheral flange of the lower shell 2 in which each second riser 22 is formed between two adjacent second cavities 21. Both the first and second risers 12 and 22 are tightly engaged with top and bottom faces of the intermediate frame 3. A first trough 13 is formed on each of at least one first riser 12 of the upper shell 1. Also, a second trough 23 is formed on each of at least one second riser 22 of the lower shell 2. The intermediate frame 3 further comprises a positioning rib 33 provided between the first trough 13 and the second trough 23. The positioning ribs 33 are mated with the first troughs 13 or the second troughs 23. The upper shell 1 further comprises a first stop member 15 projected downward from each of at least one first riser 12. The lower shell 2 further comprises a second stop member 25 projected upward from each of at least one second riser 22. Both the first and second stop members 15 and 25 are securely engaged with upper and lower inner edges inside the flange 31 when the upper shell 1 and the lower shell 2 are assembled with the intermediate frame 3 (see FIG. 4). This can prevent the intermediate frame 3 from shifting beyond the first and second troughs 13 and 23 into both the first upper shell 1 and the lower shell 2. Also, it ensures that both the upper shell 1 and the lower shell 2 are securely engaged with the intermediate frame 3. The positioning ribs 33 are precisely engaged with both the first and second troughs 13 and 23 when both the upper shell 1 and the lower shell 2 are assembled with the intermediate frame 3. A correct positioning of the positioning ribs 33 with both the first and second troughs 13 and 23 is carried out. As an end, both inward and outward forces exerted on the upper shell 1 and the lower shell 2 are eliminated and an outward deformation of the intermediate frame 3 is thus prevented.

Moreover, preferably, thickness of the intermediate frame 3 between two adjacent positioning ribs 33 is decreased to an optimum as long as it does not detract from its external appearance. This has the benefit of increasing a section of each of the ventilation holes, resulting in an increase of air circulation. By configuring the ventilation arrangement of the upper shell 1 and the lower shell 2 as above, only a small number of ventilation holes can be seen externally and thus it is possible of preserving the electronic device's appearance. Moreover, air circulation through the upper shell 1 and the lower shell 2 are designed according to the principles of fluid mechanics.

Figure 5:
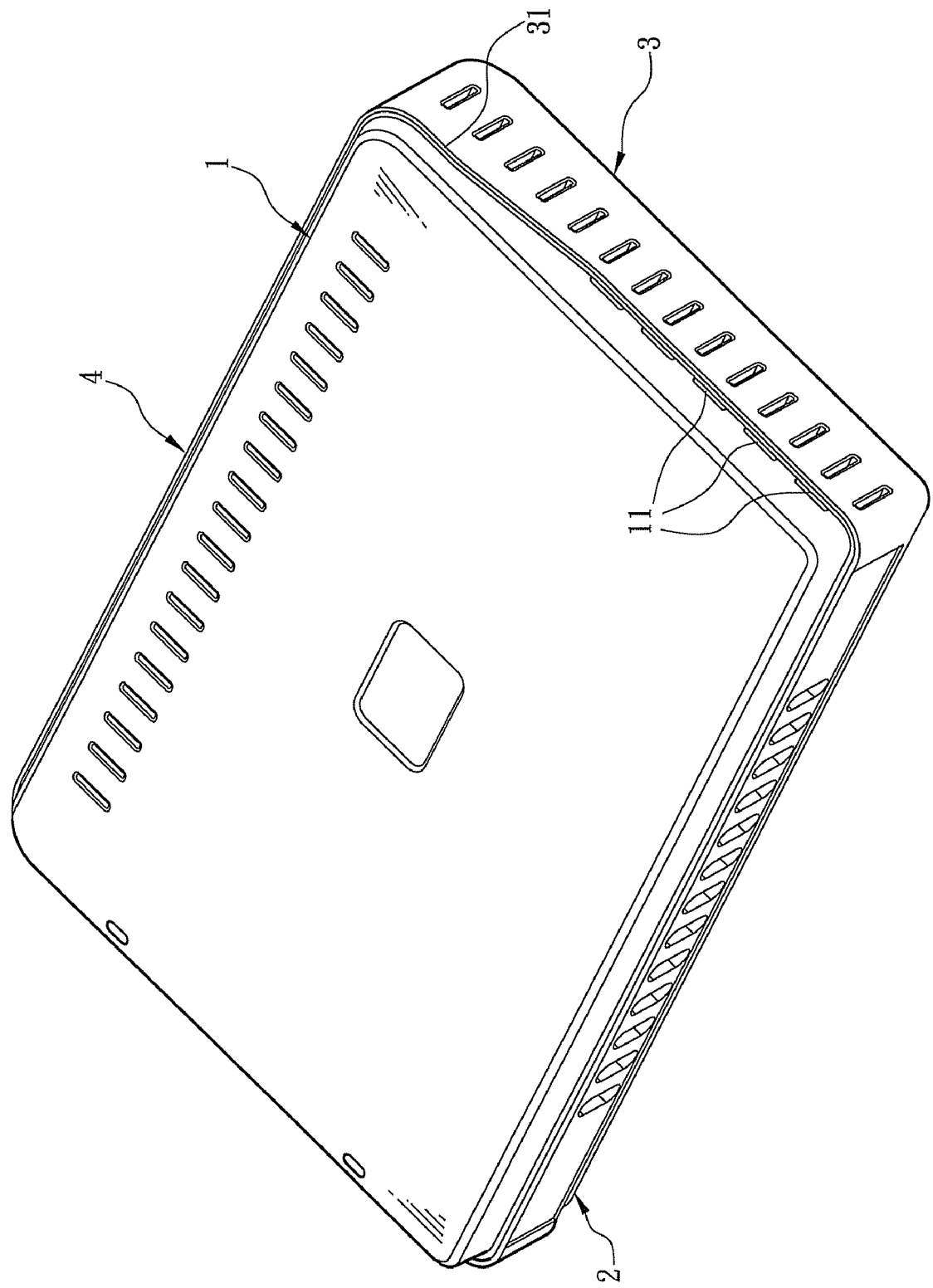
FIG. 5 is a perspective view of the housing.

Typically, it is not easy to conceal or decorate vertical gaps exposed on an electronic device. Thus, a poor design may much detract from an external appearance of the housing of an electronic device. For solving this problem, it typically involves a complicated design comprising a plurality of tabs in one member and a plurality of mated holes in the other member. It is thus possible of concealing or decorating exposed vertical gaps by inserting the tabs into the holes. Referring to FIGS. 5 and 6 a projection 36 can extend from either end of the intermediate frame 3 (see FIG. 3). Also, a front panel 4 is provided to conceal an opening formed by the upper shell 1, the lower shell 2, and the U-shaped intermediate frame 3. The panel 4 comprises two protrusions 41 each proximate either end of the intermediate frame 3. The protrusions 41 are adapted to engage with the projections 36. As such, the panel 4 is adapted to cover the intermediate frame 3 to conceal the opening of the intermediate frame 3. The panel 4 further comprises a pair of third fastening members 411 facing both the upper shell 1 and the lower shell 2 and are disposed proximate the projection 36 and the protrusion 41 respectively. The upper shell 1 further comprises a plurality of first corner wells 16 each facing the intermediate frame 3 and being proximate the positioning rib 33 of the projection 36. The lower shell 2 further comprises a plurality of second corner wells (no shown but having the same shape of the first corner wells 16) each facing the intermediate frame 3 and being proximate the third fastening member 411. The first and second corner wells 16 are adapted to receive the positioning ribs 33 and one ends of the third fastening members 411. As such, the upper shell 1 and the lower shell 2 are secured to tops and bottoms of the intermediate frame 3 and the panel 4 respectively when the upper shell 1, the lower shell 2, and the intermediate frame 3 are assembled with the panel 4.

Referring to FIGS. 5 and 6 again, vertical gaps formed between both ends of the panel 4 and the intermediate frame 3 are flared outward slightly when the upper shell 1 is not covered on the lower shell 2 and the intermediate frame 3. Next, assemble the upper shell 1 and the lower shell 2 with the intermediate frame 3. In this position, the first and second corner wells 16 are adapted to push the positioning ribs 33 and both ends of the third fastening members 411 inward in order to decrease the vertical gaps between both ends of the panel 4 and the intermediate frame 3. Next, the energized positioning ribs 33 and both ends of the third fastening members 411 expand outward to tightly engage with the first and second corner wells 16. As such, the upper shell 1 and the lower shell 2 are secured by the positioning ribs 33 and both ends of the third fastening members 411. As an end, an accidental opening of either the upper shell 1 or the lower shell 2 is made impossible.

While the invention herein disclosed has been described by means of specific embodiments, numerous modifications and variations could be made thereto by those skilled in the art without departing from the scope and spirit of the invention set forth in the claims.

What is claimed is:

1. A housing of an electronic device having a plurality of hidden ventilation holes comprising:
   an intermediate frame (3) in a U-shape including a flange (31) formed upright along outer edges thereof, a plurality of positioning ribs (33) disposed on an inner surface of the intermediate frame (3), an opening (37) formed between two ends of the intermediate frame (3), and a connection rib (34) having two ends disposed on the inner surface of the intermediate frame (3) and interconnected the two ends of the intermediate frame (3) respectively;
   an upper shell (1) disposed on one side of the intermediate frame (3) and having an outer surface thereof against the inner surface of the intermediate frame (3), wherein the upper shell (1) includes a plurality of first cavities (11) and a plurality of first troughs (13) formed along a lower edge thereof and at least one first fastening member (10) disposed on an inner surface of the upper shell (1), the first cavities (11) are spaced apart and hidden behind the flange (31) for allowing air to pass through, the first troughs (13) are spaced apart for respectively receiving and positioning an upper end of the positioning rib (33) corresponding thereto, and the first fastening member (10) is extended downward inside the intermediate frame (3);
   a lower shell (2) disposed on another side of the intermediate frame (3) corresponding to the upper shell (1) and having an outer surface thereof against the inner surface of the intermediate frame (3), wherein the lower shell (2) including a plurality of second cavities (21) and a plurality of second troughs (23) formed along an upper edge thereof and at least one second fastening member (20) disposed on an inner surface of the lower shell (2), the second cavities (21) are spaced apart and hidden behind the flange (31) for allowing air to pass through, the second troughs (23) are spaced apart for respectively receiving and positioning a lower end of the positioning rib (33) corresponding thereto, and the second fastening member (20) is extended upward inside the intermediate frame (3) and is secured to the first fastening member (10) at a position inside the intermediate frame (3); and
   a panel (4) disposed on the upper shell (1) at a position for concealing the opening (37) of the intermediate frame (3).

2. The housing of claim 1, wherein the intermediate frame (3) further comprises two projections (36) extended from the ends thereof respectively, and the panel (4) further comprises two protrusions (41) extended from the ends thereof respectively and engaged with the projections (36) corresponding thereto.

3. A housing of an electronic device having a plurality of hidden ventilation holes comprising:
   an intermediate frame (3) in a U-shape including a flange (31) formed upright along outer edges thereof, a plurality of positioning ribs (33) disposed on an inner surface of the intermediate frame (3), an opening (37) formed between two ends of the intermediate frame (3), and a connection rib (34) having two ends disposed on the inner surface of the intermediate frame (3) and interconnected the two ends of the intermediate frame (3) respectively;
   an upper shell (1) disposed on one side of the intermediate frame (3) and having an outer surface thereof against the inner surface of the intermediate frame (3), wherein the upper shell (1) includes a plurality of first cavities (11) and a plurality of first troughs (13) formed along a lower edge thereof and at least one first fastening member (10) disposed on an inner surface of the upper shell (1), the first cavities (11) are spaced apart and hidden behind the flange (31) for allowing air to pass through, the first troughs (13) are spaced apart for respectively receiving and positioning an upper end of the positioning rib (33) corresponding thereto, and the first fastening member (10) is extended downward inside the intermediate frame (3);
   a lower shell (2) disposed on another side of the intermediate frame (3) corresponding to the upper shell (1) and having an outer surface thereof against the inner surface of the intermediate frame (1), wherein the lower shell (2) including a plurality of second cavities (21) and a plurality of second troughs (23) formed along an upper edge thereof and at least one second fastening member (20) disposed on an inner surface of the lower shell (2), the second cavities (21) are spaced apart and hidden behind the flange (31) for allowing air to pass through, the second troughs (23) are spaced apart for respectively receiving and positioning a lower end of the positioning rib (33) corresponding thereto, and the second fastening member (20) is extended upward inside the intermediate frame (3) and is secured to the first fastening member (10) at a position inside the intermediate frame (3); and a panel (4) disposed on the lower shell (2) at a position for concealing the opening (37) of the intermediate frame (3).

4. The housing of claim 3, wherein the intermediate frame (3) further comprises two projections (36) extended from the ends thereof respectively, and the panel (4) further comprises two protrusions (41) extended from the ends thereof respectively and engaged with the projections (36) corresponding thereto.

* * * * *